US012235008B2

United States Patent
Clark

(10) Patent No.: US 12,235,008 B2
(45) Date of Patent: Feb. 25, 2025

(54) HIGH RESOLUTION WIDE RANGE PRESSURE SENSOR

(71) Applicant: DIGITAL PORPOISE, LLC, Austin, TX (US)

(72) Inventor: Jason Wilfred Clark, Milford, NH (US)

(73) Assignee: Digital Porpoise, LLC, Austin, TX (US)

(*) Notice: Subject to any disclaimer, the term of this patent is extended or adjusted under 35 U.S.C. 154(b) by 497 days.

(21) Appl. No.: 17/456,254

(22) Filed: Nov. 23, 2021

(65) Prior Publication Data
US 2022/0163228 A1 May 26, 2022

Related U.S. Application Data

(60) Provisional application No. 63/118,292, filed on Nov. 25, 2020.

(51) Int. Cl.
*F24F 11/74* (2018.01)
*F24F 11/52* (2018.01)
(Continued)

(52) U.S. Cl.
CPC ............. *F24F 11/74* (2018.01); *F24F 11/52* (2018.01); *F24F 11/63* (2018.01); *G01K 1/08* (2013.01);
(Continued)

(58) Field of Classification Search
CPC .......... G01K 7/22; G01K 1/08; G01K 13/024; H05K 7/20818; H05K 7/20836;
(Continued)

(56) References Cited

U.S. PATENT DOCUMENTS 3,898,638 A 8/1975 Deane
4,083,244 A 4/1978 Agar et al.
(Continued)

FOREIGN PATENT DOCUMENTS

CN 110031650 7/2019
EP 0267354 5/1988
(Continued)

OTHER PUBLICATIONS

Karki, et al. "Techniques for Controlling Airflow Distribution in Raised-Floor Data Centers." Innovative Research, Inc. (2003) 8 pages.
(Continued)

*Primary Examiner* — John H Le
(74) *Attorney, Agent, or Firm* — Knobbe, Martens, Olson & Bear, LLP

(57) ABSTRACT

A solid-state sensor, including an enclosure having a first opening in a first side of the enclosure and a second opening in a second side of the enclosure, a first passageway in fluid communication with the first and second openings, and a solid-state direction sensor positioned within the first passageway. The solid-state direction sensor can include a first sensor positioned at a first axial position, a second sensor positioned at a second axial position, and a flow deflector positioned at a third axial position that is between the first and second axial positions. The flow deflector can extend into the first passageway so as to constrict the first passageway.

20 Claims, 11 Drawing Sheets

(51) Int. Cl.

| | | |
|---|---|---|
| *F24F 11/63* | (2018.01) | |
| *F24F 110/10* | (2018.01) | |
| *F24F 110/30* | (2018.01) | |
| *F24F 110/40* | (2018.01) | |
| *G01K 1/08* | (2021.01) | |
| *G01K 7/22* | (2006.01) | |
| *G01K 13/024* | (2021.01) | |
| *G05B 17/02* | (2006.01) | |
| *H05K 7/20* | (2006.01) | |

(52) U.S. Cl.
CPC ............ *G01K 7/22* (2013.01); *G01K 13/024* (2021.01); *G05B 17/02* (2013.01); *H05K 7/20818* (2013.01); *H05K 7/20836* (2013.01); *F24F 2110/10* (2018.01); *F24F 2110/30* (2018.01); *F24F 2110/40* (2018.01)

(58) Field of Classification Search
CPC . G01F 1/69; G01F 1/72; G01F 1/6842; G01F 15/14; G05B 17/02; F24F 11/52; F24F 11/63; F24F 11/74; F24F 2110/10; F24F 2110/30; F24F 2110/40
USPC .......................................................... 702/45
See application file for complete search history.

(56) References Cited

U.S. PATENT DOCUMENTS

| | | | |
|---|---|---|---|
| 4,241,868 A * | 12/1980 | Perkins .................. | F16K 19/00 236/94 |
| 4,363,238 A | 12/1982 | William | |
| 4,787,251 A | 11/1988 | Kolodjski | |
| 4,986,122 A | 1/1991 | Gust | |
| 5,461,910 A | 10/1995 | Hodson et al. | |
| 5,520,047 A | 5/1996 | Takahashi et al. | |
| 5,929,333 A | 7/1999 | Nair | |
| 6,321,870 B1 * | 11/2001 | Waronitza ............ | F23M 20/005 181/222 |
| 7,291,759 B2 | 11/2007 | Heidemann et al. | |
| 7,347,092 B1 | 3/2008 | Ross | |
| 7,987,709 B2 | 8/2011 | Barre et al. | |
| 8,291,758 B2 | 10/2012 | Galley et al. | |
| 8,348,731 B2 | 1/2013 | Johnson et al. | |
| 8,521,449 B2 | 8/2013 | Hamann et al. | |
| 8,725,307 B2 | 5/2014 | Healey et al. | |
| 9,046,397 B2 | 6/2015 | Pfau et al. | |
| 9,857,235 B2 | 1/2018 | Hamann et al. | |
| 9,884,157 B2 | 2/2018 | Weitzel et al. | |
| 2002/0108451 A1 | 8/2002 | May et al. | |
| 2005/0006489 A1 | 1/2005 | Meyer et al. | |
| 2009/0088873 A1 * | 4/2009 | Avery ..................... | G06F 1/206 700/51 |
| 2017/0108527 A1 | 4/2017 | Harada et al. | |
| 2017/0188486 A1 | 6/2017 | Vangilder et al. | |
| 2020/0116534 A1 | 4/2020 | Hase et al. | |

FOREIGN PATENT DOCUMENTS

| | | |
|---|---|---|
| EP | 1877950 | 11/2018 |
| GB | 2301188 A | 11/1996 |
| JP | H04 29017 A | 1/1992 |
| JP | 55-68961 | 8/2014 |
| JP | 64-94811 | 4/2019 |

OTHER PUBLICATIONS

Patankar, Suhas "Airflow and Cooling in a Data Center", Journal of Heat Transfer , Jul. 2010, vol. 132, 17 pages.

PCT Search Report and Written Opinion for Application No. PCT/US2021/072586, dated May 11, 2022, 17 pages.

Vangilder et al. "Capture Index: An Airflow-Based Rack Cooling Performance Metric", 2007, 1 page.

* cited by examiner

Equation utilized to convert device flow to differential pressure

Bernoulli's equation:

$$Q = CA_2\sqrt{2(P_1 - P_2)/\rho}$$

Simplified for air:

$$Q = K(\sqrt{\Delta p})$$

Simplified for finding differential pressure:

$$\frac{Q}{K} = \sqrt{\Delta p}$$

Simplified for finding pressure:

$$\left(\frac{Q}{K}\right)^2 = \Delta p$$

Velocity Sensor:
Measures air velocity

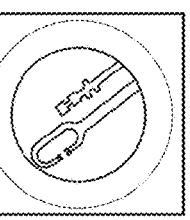

Direction Sensor:
Used to determine which side of space is positive or negative.

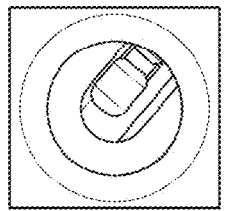

Whereas:
Q = Velocity (ft/min) as measured by velocity sensor
K = Density Constant Air (+/- 4005) adjusted at calibration
Δp = Pressure Delta (in WC.) output
P = Pressure readings on both side of opening
ρ = Density of fluid (air)
C = Velocity constant

FIG. 6

HIGH RESOLUTION WIDE RANGE PRESSURE SENSOR

PRIORITY CLAIM AND INCORPORATION BY REFERENCE

The present application claims priority from U.S. Patent Application No. 63/118,292, filed on Nov. 25, 2020, titled HIGH RESOLUTION WIDE RANGE PRESSURE SENSOR, the contents of which is hereby incorporated by reference herein in its entirety as if fully set forth herein. The benefit of priority is claimed under the appropriate legal basis including, without limitation, under 35 U.S.C. § 119 (e). Any and all applications for which a foreign or domestic priority claim is identified in the Application Data Sheet as filed with the present application are hereby incorporated by reference herein in their entirety and made a part of this specification.

BACKGROUND OF THE DISCLOSURE

Field of the Disclosure

Embodiments of the present disclosure relate to airflow sensors, including pressure sensors.

Background

Contained spaces within a data center, such as hot and cold aisles, can be controlled or monitored with pressure sensors. The data center airflow consists of series of fans that are modulating to control different control variables within the system. The temperature in the server is typically controlled by a fan within the server and the fan is modulated to ensure the server stays cool. Fans within the cooling systems, perimeter air conditioning units, in-row coolers, even rear door heat exchangers, can be controlled with respect to pressure or temperature setpoints.

SUMMARY OF SOME EXEMPLIFYING EMBODIMENTS

The systems, methods and devices of this disclosure each have several innovative aspects, implementations, or aspects, no single one of which is solely responsible for the desirable attributes disclosed herein.

Disclosed herein are embodiments of sensors or sensor assemblies, methods of using sensors, and systems including the sensors disclosed herein. In some embodiments, the sensor assembly can include an enclosure having a first opening in a first side of the enclosure and a second opening in a second side of the enclosure, a first passageway in fluid communication with the first and second openings, and a solid-state sensor positioned within the first passageway. In some embodiments, the solid-state sensor can include a first sensor (which can also be referred to herein as a first sensor component) positioned at a first axial position in the first passageway, a second sensor (which can also be referred to herein as a second sensor component) positioned at a second axial position in the first passageway, and a flow deflector positioned at a third axial position in the first passageway that is between the first and second axial positions. In some embodiments, the flow deflector can extend into the first passageway so as to constrict the first passageway.

Any embodiments of the sensor assembly, systems, and methods disclosed herein can include, in additional embodiments, one or more of the following steps, features, components, and/or details, in any combination with any of the other steps, features, components, and/or details of any other embodiments disclosed herein: wherein the flow deflector can be configured to deflect at least a portion of a flow of a fluid flowing through the first passageway in a first direction around the second sensor but not the first sensor, wherein the second sensor is downstream of the first sensor when a fluid is flowing in the first direction; wherein the flow deflector can be configured to deflect at least a portion of a flow of a fluid flowing through the first passageway in a second direction around the first sensor but not the second sensor, wherein the first sensor is downstream of the second sensor when a fluid is flowing in the second direction; wherein the flow deflector includes a first recess on a first side of the flow deflector and a second recess on a second side of the flow deflector; wherein the first sensor is positioned adjacent to the first recess and the second sensor is positioned adjacent to the second recess; wherein the first and second recesses are positioned symmetrically about the flow deflector and/or the deflector has a symmetrical shape; wherein the device can include a first channel extending from the first opening to the second opening; wherein the first passageway extends through the first channel; wherein the sensor further includes an airflow velocity sensor; wherein the sensor further includes an airflow velocity sensor positioned within a second passageway of the enclosure; wherein the solid-state sensor can be used in a data center; wherein at least one of the first and second sensors is a thermistor element that has a positive temperature coefficient (PTC); wherein the sensor is configured to measure a temperature of the air flowing through the sensor; and/or wherein the sensor or any system or method using the sensor can be configured to determine the pressure using at least Bernoulli's equation.

Disclosed herein are embodiments of systems including any of the embodiments of the sensor assemblies disclosed herein. In some embodiments, the system can include a solid-state sensor and a processor configured to determine a pressure difference across the sensor. In some embodiments, the system can be configured to determine the pressure at a high degree of accuracy.

Disclosed herein are embodiments of a system for controlling a thermal management system in a data center having a first zone and a second zone. In some embodiments, the system for controlling a thermal management system in a data center having a first zone and a second zone can include any of the embodiments of the solid-state sensor disclosed herein and a controller for cooling air supplied to the first zone. In some embodiments, the solid-state sensor can be located in a partition between a first zone and a second zone. In some embodiments, the controller can be configured to increase a flow of air to the cooling zone when either a pressure differential between the cooling zone and the hot zone drops below a threshold value and/or wherein a direction of a flow of air through the solid-state sensor is from the hot zone to the cooling zone. In any embodiments, the first zone can be a cooling zone and the second zone can be a hot zone.

Disclosed herein are embodiments of a method of using any embodiments of the sensors or sensor assemblies disclosed herein, wherein the method is used to control air flow within a data center. Also disclosed herein are embodiments of a method of measuring a direction of fluid flow in a passageway. In some embodiments, the method can include providing a first current to a first temperature sensor, measuring a first resistance of the first temperature sensor as a fluid is flowing through the passageway, providing a second current to a second temperature sensor, and, measuring a second resistance of the second temperature sensor as the fluid is flowing through the passageway, and comparing the first resistance to the second resistance to determine a direction of the fluid flow. In some embodiments, the second temperature sensor can be positioned so as to be spaced apart from the first temperature sensor. In some embodiments, a flow deflector of any of the embodiments disclosed herein can be positioned between the second temperature sensor and the first temperature sensor.

Any embodiments of the sensors (including the embodiments of the solid-state sensors), sensor assemblies, systems, and methods disclosed herein can include, in additional embodiments, one or more of the following steps, features, components, and/or details, in any combination with any of the other steps, features, components, and/or details of any other embodiments disclosed herein: wherein the flow deflector includes a first recess on a first side of the flow deflector and a second recess on a second side of the flow deflector; wherein the first sensor is positioned in the first recess and the second sensor is positioned in the second recess; wherein the first and second recess are positioned symmetrically about the flow deflector; wherein the method further includes determining flow direction within a data center; wherein the method further includes determining flow direction through a partition between a hot and cold zone within a data center.

Disclosed herein are embodiments of a method of measuring a pressure of fluid flowing in a system, that can include measuring a temperature of the fluid flowing through the system using a first temperature sensor, providing a first current to the first temperature sensor, measuring a first resistance of the first temperature sensor as a fluid is flowing past the first temperature sensor, providing a second current to a second temperature sensor, measuring a second resistance of the second temperature sensor as the fluid is flowing past the second temperature sensor, and comparing the first resistance to the second resistance. In some embodiments, the second temperature sensor can be positioned apart from the first temperature sensor and a flow deflector of any of the embodiments disclosed herein can be positioned between the second temperature sensor and the first temperature sensor. In some embodiments, the method can also include measuring a velocity of fluid flow in the system, and determining a pressure of the fluid flowing in the system. In some embodiments, the method can include determining a direction of the fluid flowing in the system by comparing the first resistance to the second resistance. In some embodiments, the method can include transmitting pressure differential, pressure, temperature, and/or direction of flow of the fluid. In some embodiments, measuring a pressure of fluid flowing in a system can include measuring a pressure of fluid flowing in the system through a fixed opening.

Disclosed herein are embodiments of a data center climate control system that can include systems for control of a cooling system for IT Equipment in a data center. Some embodiments of the data center climate control system can include any of the embodiments of the sensors or sensor assemblies disclosed herein positioned in a partition or boundary between different zones of a space in which temperature is being controlled (e.g., a data center). In some embodiments of the data center climate control system, the system can be configured to calculate a pressure differential between opposite sides of the partition or boundary between different zones of a space in which temperature is being controlled by sensing properties of the flow imparted on the sensor or sensor assemblies and/or different components of the sensor. Disclosed herein are embodiments of a method of measuring airflow properties substantially as described below or shown in the accompanying drawings. Disclosed herein are embodiments of a solid-state airflow sensor substantially as described below or shown in the accompanying drawings.

BRIEF DESCRIPTION OF THE DRAWINGS

FIG. 6 illustrates the equations used to convert device flow to differential pressure.

DETAILED DESCRIPTION OF SOME EXEMPLIFYING EMBODIMENTS

Figure 1:
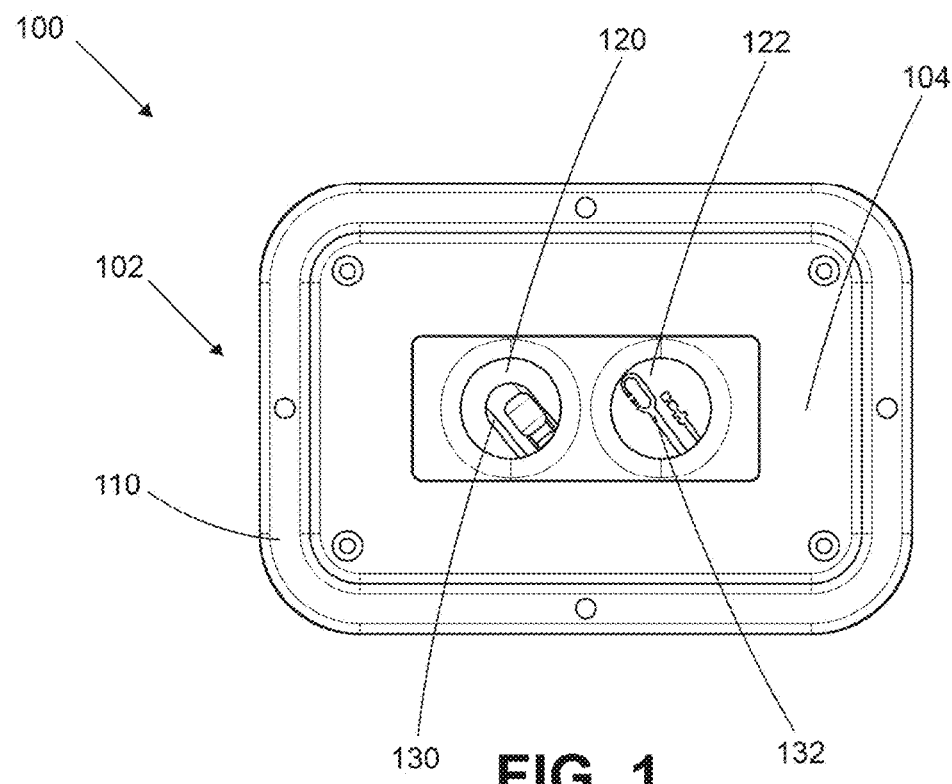
FIG. 1 is a front view of an embodiment of a sensor assembly including a solid-state airflow sensor.

In many facilities, fans of one type are not typically synced with fans of other types. For example, the facility fans (including AC fans and other air movers) in typical facilities and data centers operate independently of server fans, etc. and not as a coordinated system. In some arrangements, fans in data centers can operate in conjunction with server fans. Independent control coupled with air containment systems produce a condition where air can be in deficit or surplus supply within the spaces. This can happen multiple times per day, depending on server loads. Reducing deficit and surplus supply air conditions is very important to maintain proper operating temperatures and conditions in a data center and also to the efficient operation of data center airflow systems. In deficit conditions, servers can overheat, leading to malfunctions and damage to valuable equipment, and/or processors can operate more slowly, leading to lower performance and higher operating costs. In surplus conditions, energy is wasted, leading to lower efficiency and higher operating costs.

An aspect of the disclosure herein is the recognition that with conventional sensors, the sensors typically need to be calibrated periodically due to drift in the readings and are generally sensitive to rapid pressure changes, which can cause damage to such sensors. Some embodiments of the sensors disclosed herein can be configured to operate for an extended period of time, or, in some embodiments, indefinitely, before needing to be checked for calibration or needing to be calibrated. In other words, in some embodiments, the sensor can operate indefinitely without calibration or can operate with less frequent calibration. Further, conventional sensors are typically expensive and are only designed to read pressure. Very low-pressure values can be difficult to read with conventional sensors and means. Some embodiments of the sensors disclosed herein can read very low pressure values with high accuracy. For example and without limitation, most conventional sensors will have an accuracy of approximately 98-99% or 98-99% over the full range, with 98% repeatability over a year. Some embodiments of the sensors 100 disclosed herein can have an accuracy of at least 99.75%, or greater than approximately 99.75% over the full range, and at least 99.75% repeatability per year.

Some sensors can read positive and negative pressure, however 50% of the full range of the sensor output is dedicated for the positive side of the range and 50% of the full range of the sensor output is dedicated for the negative side of the range. Resolution can be a problem with these types of sensors due to the reduced resolution. Conventional split sensors (i.e., sensors that read positive and negative ranges) have an output range that is in the middle of the total range. For example, a 0-5 volt sensor with no pressure applied will read 2.5 volts. Half of the range is typically for reading pressure in each direction and the ability for automation systems to translate that very small range is problematic. The embodiments of the sensors disclosed herein read a full range with pressure on either side of the middle point of the range, resulting in a much greater resolution. For example, some embodiments of the sensors disclosed herein have double the resolution of conventional split sensors. Consequently, one can buy a sensor that reads only positive pressure and get a fair reading. However, if the pressure moves to the negative range or to beyond the low limit, the conventional sensor will read zero regardless of the difference in pressure.

As mentioned above, problems can result when air is under or over supplied in a data center climate control system. Oversupply can cause excessive costs to cool IT equipment and undersupply can cause overheating and reduced server performance. Typically, a pressure sensor would be deployed to monitor or control the pressure in contained space. The pressure readings are usually differential pressure readings between the inside and outside of the containment zone or room. The absolute pressures and pressure differentials can be very small and thus hard to measure. Therefore, resolution and range are concerns for pressure sensors used for this purpose. A sensor with a large range of readings can have poor resolution but can allow for a wider band of setpoints. Conversely, a narrow range sensor can have good resolution and controls in a very narrow setpoint range.

The embodiments of the solid-state sensor 100 (also referred to herein as a solid-state airflow sensor and a solid-state pressure sensor) disclosed herein provide a better solution for monitoring and measuring airflow properties including, without limitation, direction, pressure, velocity, and/or temperature, in data centers. The embodiments of the solid-state sensor 100 disclosed herein can be used for any of a wide range of applications where flow characteristics or properties of a flowing or moving fluid (liquid or gas) are desired to be measured. As described below, the solid-state sensor 100 can be designed and manufactured to have no moving parts, and can be designed and manufactured to be fully electronic.

Monitoring of airflow in containment systems is most often accomplished with pressure transducers. These transducers often contain MEMS (miniature electro-mechanical systems) circuits. The MEMS contain a membrane that flexes a miniature strain gage to send an electrical current to signal conditioning electronics and eventually a control system. Conventional sensors typically need to be hardwired back to a building management system to be processed. This can be costly and invasive as a retrofit. When purchasing these devices, a range of pressure readings must be specified. The range of this sensor is fixed and relates to the linear output of the sensor. Some embodiments of the solid-state sensor 100 are configured such that flow through a fixed opening or openings is used to calculate airflow properties, in contrast with other systems in which pressure is read directly. Advantages of some embodiments of the solid-state sensor 100 include the ability to read a wide range of pressures without accuracy loss, less or no susceptibility to pressure spikes, significantly less calibration required, no moving parts to wear out, and more accurate readings at low pressure differentials. Note that the solid-state sensor 100 is also referred to herein as a sensor assembly or a solid-state sensor assembly. Conventional pressure sensors only read pressure. As mentioned, any embodiments of the solid-state sensor 100 can read air flow direction, pressure, velocity, and temperature, reducing the cost of additional temperature sensors over standard pressure only sensors. Any embodiments of the solid-state sensor 100 disclosed herein can be configured to be an IoT (internet of things) device, further reducing the implementation cost over conventional means. Any embodiments of the solid-state sensor 100 disclosed herein can be hardwired.

Airflow direction can be measured by directing air over two thermistor elements. In some embodiments, the two thermistor elements can each be a positive temperature coefficient (PTC) sensor. In some embodiments, the two thermistor elements can each be a negative temperature coefficient (NTC) sensor. These elements change resistance based on their temperature. Typical application for these devices is to measure temperature. In some embodiments, with PTC sensors, as the temperature around the sensors increases, the resistance will increase. In some embodiments, with NTC sensors, as the temperature around the sensors increases, the resistance will decrease. By nature, some thermistors self-heat or warm with the small electrical current that is required to measure temperature. Some embodiments of the solid-state airflow sensor can be configured to intentionally cause self-heating of two PTC temperature sensors and can measure the difference in current draw between two sensors (i.e., the first and second sensors 142, 144 described below). In any embodiments, the first and second sensors 142, 144 can be maintained at a temperature that is above the operating ambient temperature. For example and without limitation, the first and second sensors 142, 144 can be maintained at 120-130 degrees Fahrenheit, or otherwise at a temperature that is above the temperature of the air drawn from the IT cabinets or, in some embodiments, above the temperature of any air that the sensors would be exposed to. In any embodiments the current supplied to the sensors can be adjusted by the microprocessor in the unit to maintain a certain temperature above ambient (i.e. 12° F.) or controlled to maintain a static temperature (i.e., 120° F.).

When airflow is not moving, the two sensors of some embodiments will not essentially the same temperature. In some embodiments, air flowing across an air baffle or flow deflector positioned between the PTC sensors can cause an imbalanced amount of air imparted on the sensors, removing their heat energy, and changing the read temperature. This imbalance can cause different current readings between the sensors, which can be used to indicate airflow direction. In some embodiments, the leading PTC sensor will be cooler due to its exposure to airflow and the downstream sensor is shielded by a flow deflector and its temperature will be higher as a result. In some embodiments, the sensor can be symmetrical such that the flow deflector will be positioned at the midpoint between the first and second sensors and airflow in the opposite direction will be measured in the same way with opposite effects on the current draw. As mentioned above, direction of airflow is important for identifying surplus or deficit pressure conditions. In certain embodiments, the PTC sensors are positioned within recesses formed on either side of the flow deflector.

Figure 2:
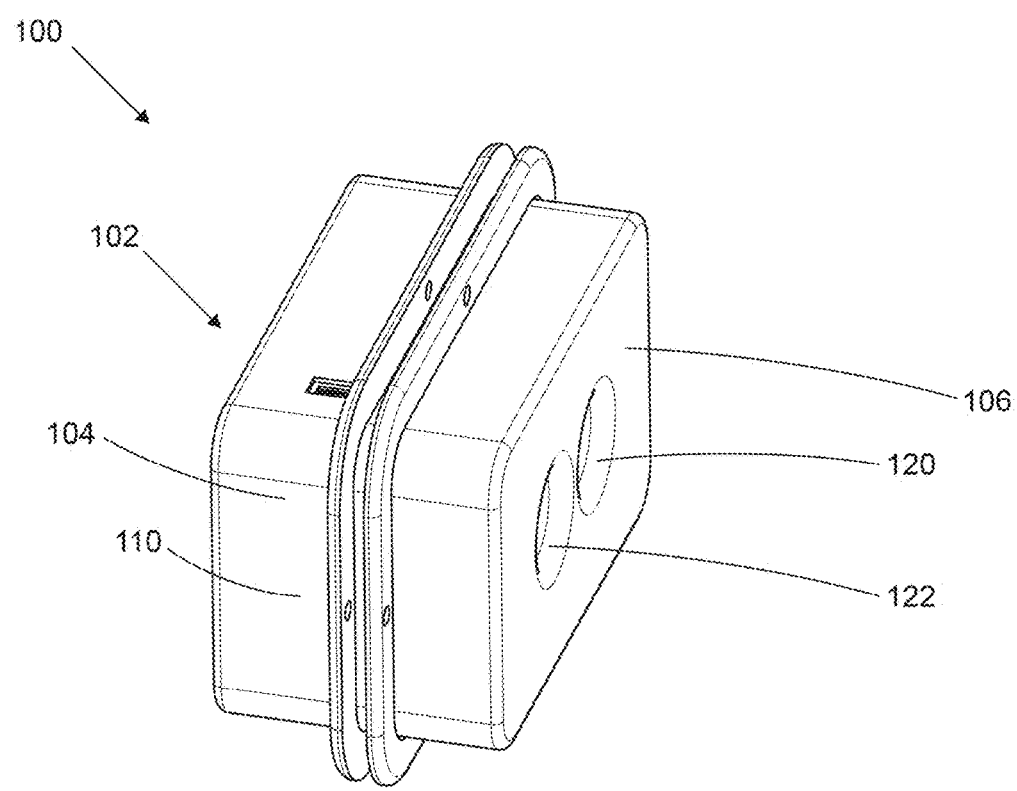
FIG. 2 is an orthogonal view of the embodiment of the sensor assembly shown in FIG. 1.

FIGS. 1 and 2 are a front view and an orthogonal view, respectively, of an embodiment of a solid-state airflow sensor device 100. In some embodiments, the solid-state sensor 100 can have an enclosure or case 102 (also referred to as a housing) that can be used to house or contain the electronics of the solid-state sensor 100. The case 102 can include a first case portion 104 that can be coupleable with or otherwise joined with a second case portion 106. For example and without limitation, the first and second case portions 104, 106 can each have a mounting flange 110 that can be used to couple the first and second case portions 104, 106 together. The case 102 can have a first passageway 120 and second passageway 122 therethrough that can permit a flow of fluid through the case 102. The first and second passageways 120, 122 can be fixed openings. The case 102 and the first and second passageways 120, 122 can be configured so that air can flow through the first and second passageways 120, 122 in either direction. The device 100 can be positioned in a partition or boundary between different zones of a space in which temperature is being controlled (e.g., a data center). As will be explained below, the pressure differential between the opposite sides of the partition or boundary can be determined by sensing properties of the flow through the first and second passageways 120, 122. In certain embodiments, the first and second passageways 120, 122 are positioned within 1 to 2 inches of each other. While in the illustrated embodiment, the sensor 100 includes an enclosure or case 102 that includes both the first and second passageways 120, 122, in certain embodiments that sensor can comprise more than one case wherein each of the first and second passageways 120, 122 are positioned in a separate case that are arranged such that the first and second passageways 120, 122 are positioned within 12 to 24 inches of each other.

A direction sensor 130 can be positioned within the first passageway 120. A velocity sensor 132 can be positioned within the second passageway 122. Therefore, the direction sensor 130 can be exposed to fluid passing through the first passageway 120 and the velocity sensor 132 can be exposed to fluid passing through the second passageway 122.

Figure 3:
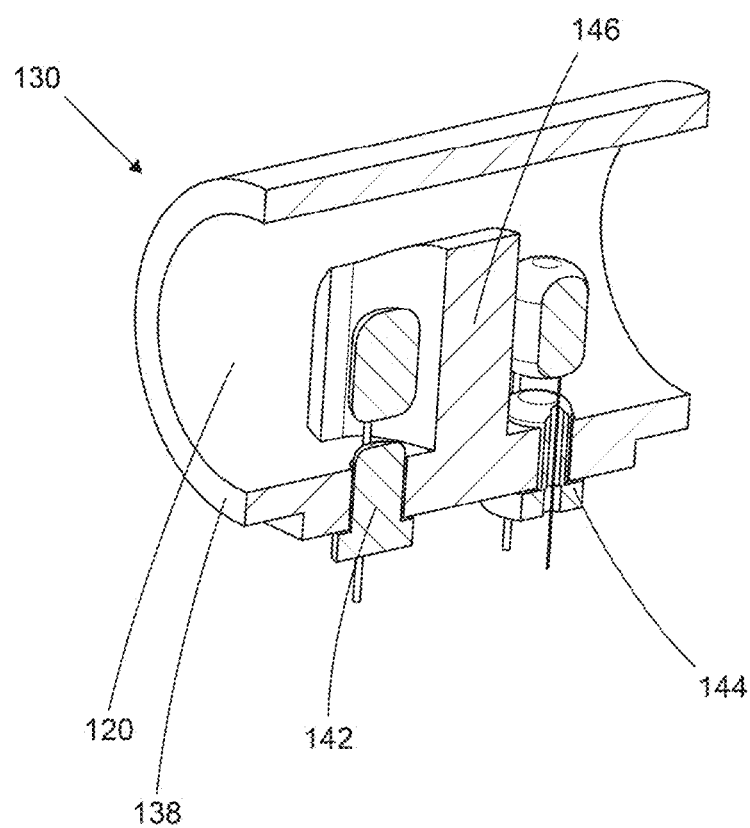
FIG. 3 is a cross-section view of the embodiment of the solid-state sensor of the sensor assembly embodiment shown in FIG. 1.

FIG. 3 is a cross-section view of the embodiment of the direction sensor 130 of the solid-state sensor 100 embodiment shown in FIG. 1. With reference to FIG. 3, the direction sensor 130 can be positioned or supported within a first channel 138 having the first passageway 120 extending axially therethrough. The direction sensor 130 can have a first sensor 142 at a first axial position within the first passageway 120, a second sensor 144 at a second axial position within the first passageway 120, and a flow deflector 146 (also referred to herein as a baffle or as a projection) at a third axial position within the first passageway 120, between the first and second sensors 142, 144 and/or between the first and second axial positions. The first and second sensors 142, 144 can be the same or, in some embodiments, can be configured to be different. In some embodiments, the first and second sensors 142, 144 can each comprise a thermistor element that have a positive temperature coefficient (PTC). An example of a thermistor element that can be used for some embodiments of the first and second sensors 142, 144 is the thermistor PTC 330 Ohm 20% Radial Lead 5 mm Lead Spacing thermistor sold by ntepartsdirect.com (https://www.ntepartsdirect.com/ENG/PRODUCT/02-P331-1), though there are many other similar and/or suitable products that could be used.

Figure 4:
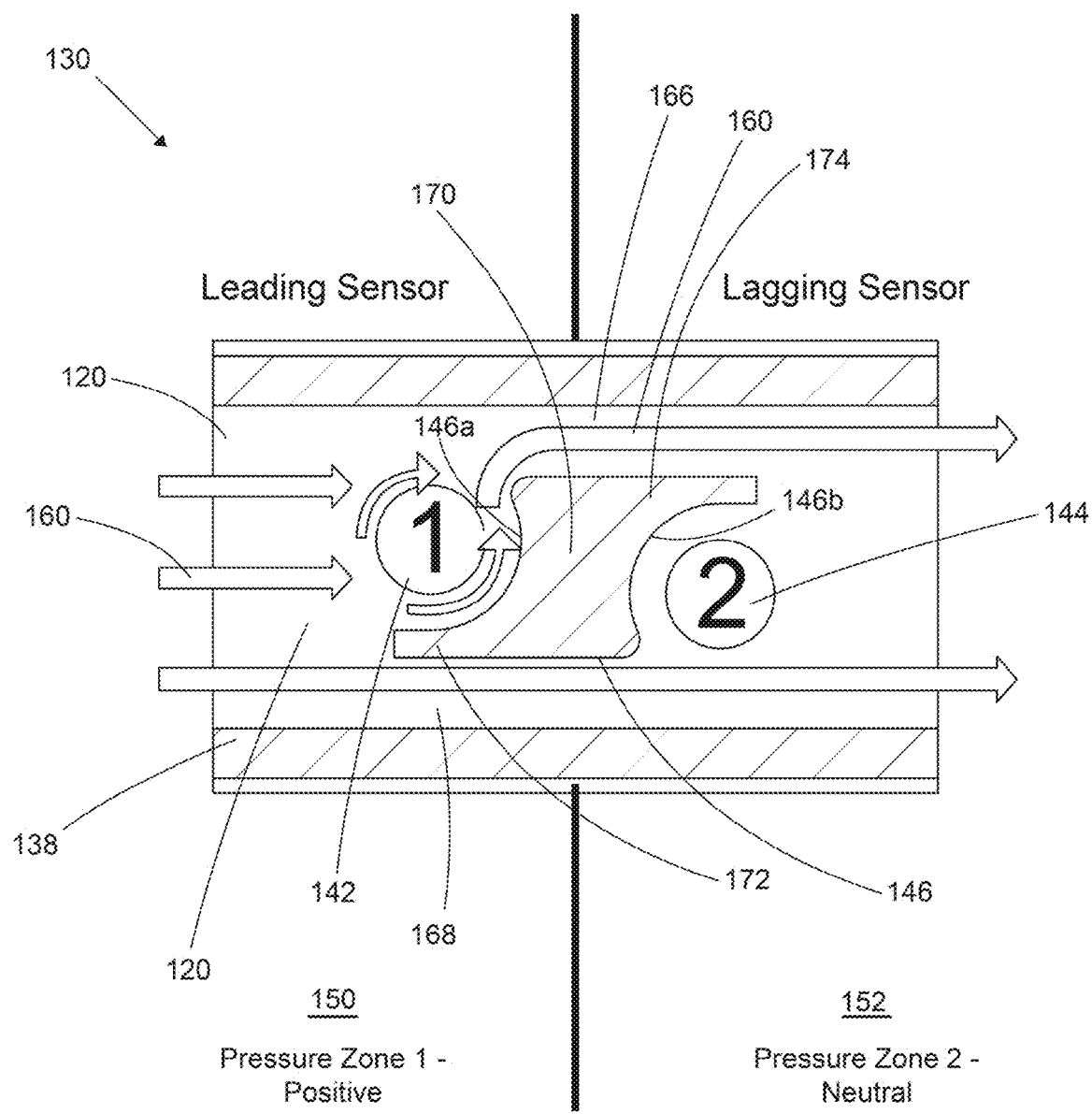
FIG. 4 illustrates a mode of operation of the solid-state sensor in a condition where air is flowing in a first axial direction, i.e., such that the first pressure zone on the left side of the flow deflector is upstream to the second pressure zone on the right side of the flow deflector.

FIG. 4 illustrates a mode of operation of the direction sensor 130 in a condition where air is flowing in a first axial direction, i.e., such that the first pressure zone 150 on the left side (in the orientation shown in FIG. 4) of the flow deflector 146 is upstream to the second pressure zone 152 on the right side of the flow deflector 146. This illustration of FIG. 4 is a simplified illustration, meant to show one schematic, hypothetical and non-limiting example of how a fluid can flow through the direction sensor 130 and how the fluid 160 flowing through the first passageway 120 to the direction sensor 130 can be directed by the flow deflector 146. An advantage of the embodiment of FIGS. 3 and 4 is that the flow deflector 146 can be practically symmetrical. In some embodiments, the flow deflector 146 can be shaped in a specific way to bypass airflow around the leeward sensor at even very low flows. Conversely, some embodiments of the windward sensor can be in direct influence of flow.

In some embodiments, the flow deflector 146 is configured to extend across only a portion of the inside diameter of the passageway, thereby permitting flow around the flow deflector 146 along both sides of the flow deflector 146. Some embodiments of the sensor can measure very low pressure differentials between the first and second sensors. Further, in some embodiments, one or more edges of the flow deflector 146 can be rounded. Further, in some embodiments, a top of the flow deflector 146 can be domed. In some embodiments, the sensors 142, 144 can be positioned within a first and second recess of the flow deflector 146.

The flow deflector 146 can be configured to constrict the first passageway 120 of the first channel 138. The flow deflector 146 can be configured to deflect fluid flowing in a first axial direction (as shown in FIG. 4) through the passageway of the first channel 138 at least partially around the second sensor 144, the second sensor 144 being downstream of the first sensor 142 when the fluid is flowing in the first axial direction, such that the first sensor 142 will be more exposed to the fluid flowing in the first direction than the second sensor 144 will be. In this flow arrangement, the first pressure zone 150 will be positive, while the second pressure zone 152 will be neutral. This can result in a difference in the pressure and/or temperature readings of the first sensor 142 relative to the second sensor 144, thereby enabling a determination of the direction of flow of fluid through the first passageway 120.

Similarly, the flow deflector 146 can be configured to deflect fluid flowing in a second axial direction (not shown) through the first passageway 120 of the first channel 138 at least partially around the first sensor 142, the first sensor 142 being downstream of the second sensor 144 when the fluid is flowing in the second axial direction, such that the second sensor 144 will be more exposed to the fluid flowing in the second direction than the first sensor 142 will be. This can result in a difference in the pressure and/or temperature readings of the first sensor 142 relative to the second sensor 144, thereby enabling a determination of the direction of flow of fluid through the first passageway 120.

With reference to FIG. 4, some embodiments of the flow deflector 146 can have a main body portion 170 in a middle portion of the flow deflector 146, and a first extended portion 172 extending away from the main body portion 170 in a first direction (e.g., in a direction of the first sensor 142), and a second extended portion 174 extending away from the main body portion 170 in a second direction (e.g., in a direction of the second sensor 144). In some embodiments, the first extended portion 172 can extend in a direction that is alongside the first sensor 142 and the second extended portion 174 can extend in a direction that is alongside the second sensor 144.

Some embodiments of the flow deflector 146 can have a first curved portion 146a that is configured to curve around the first sensor 142 and direct a portion of the air or fluid flowing through the passageway 120 into a first portion 166 of the passageway 120. For example and without limitation, some embodiments of the flow deflector 146 can have a first curved portion 146a that is configured to curve around the first sensor 142 and direct a majority of the air or fluid flowing through the passageway 120 into the first portion 166 of the passageway 120. In some embodiments of this configuration, the flow deflector 146 can be configured to deflect at least a portion of a flow of air or fluid 160 flowing in the direction shown in FIG. 4 (i.e., such that the second sensor 144 is downstream from the first sensor 142) around the second sensor 144 but not the first sensor such that a temperature reading of the second sensor 144 will be greater than a temperature reading of the first sensor 142, where the first and second sensors 142, 144 are self-heated to a temperature that is greater than the temperature of the air flowing through the passageway 120. The deflector can be configured to be spaced away from a wall of the first passageway 120 enough to permit a portion (e.g., less than half) of the air or fluid flowing through the passageway 120 in the direction shown in FIG. 4 through the second portion 168 of the passageway 120.

Some embodiments of the flow deflector 146 can have or can also have a second curved portion 146b that is configured to curve around the second sensor 144 and direct a portion of the air or fluid flowing from right to left (i.e., in a direction that is opposite to the air flow direction shown in FIG. 4 such that the first sensor 142 is downstream from the second sensor 144) through the passageway 120 into a second portion 168 of the passageway 120. For example and without limitation, some embodiments of the flow deflector 146 can have a second curved portion 146b that is configured to direct a majority of the air or fluid flowing through the passageway 120 from right to left (i.e., in a direction that is opposite to the air flow direction shown in FIG. 4 such that the first sensor 142 is downstream from the second sensor 144) into a second portion 168 of the passageway 120. In this configuration, the flow deflector 146 can be configured to deflect at least a portion of a flow of air or fluid 160 flowing in the direction from right to left (i.e., such that the first sensor 142 is downstream from the second sensor 144) around the first sensor 142 (i.e., so as to deflect the flow of air around the first sensor 142) but not the second sensor 144 such that a temperature reading of the first sensor 142 will be less than a temperature reading of the second sensor 144, where the first and second sensors 142, 144 are self-heated to a temperature that is greater than the temperature of the air flowing through the passageway 120. The deflector can be configured to be spaced away from a wall of the first passageway 120 enough to permit a portion (e.g., less than half) of the air or fluid flowing in the direction from right to left (i.e., such that the first sensor 142 is downstream from the second sensor 144) to flow through the first portion 166 of the passageway 120. In some embodiments, it is assumed that the air imparted on the sensor will cool the sensor.

With reference to FIG. 4, in some embodiments, the flow deflector 146 can be positioned such that a longitudinal centerline axis of the flow deflector 146 (i.e., along a length of the flow deflector 146 in a direction of a flow of fluid through the first passageway 120) can be aligned with a centerline of the first passageway 120 through the conduit or channel. In some embodiments, the first and second sensors 142, 144 can be offset slightly from the centerline of the passageway 120 (e.g., by 0.075 in. from the centerline, or within 10% of the inner diameter or width of the passageway 120 from the centerline, or from 5% or approximately 5% or less to 20% or approximately 20% or more than 20% of the inner diameter or width of the passageway 120 from the centerline), which can result in the overall baffle being more compact. Further, in some embodiments, a width of the first portion 166 of the passageway 120 can be the same as or similar to a width of the second portion 168 of the passageway 120. The flow deflector 146 can be configured such that the effect of the flow deflector 146 on the fluid flowing through the passageway 120 is the same or substantially the same regardless of a direction of flow.

Figure 5:
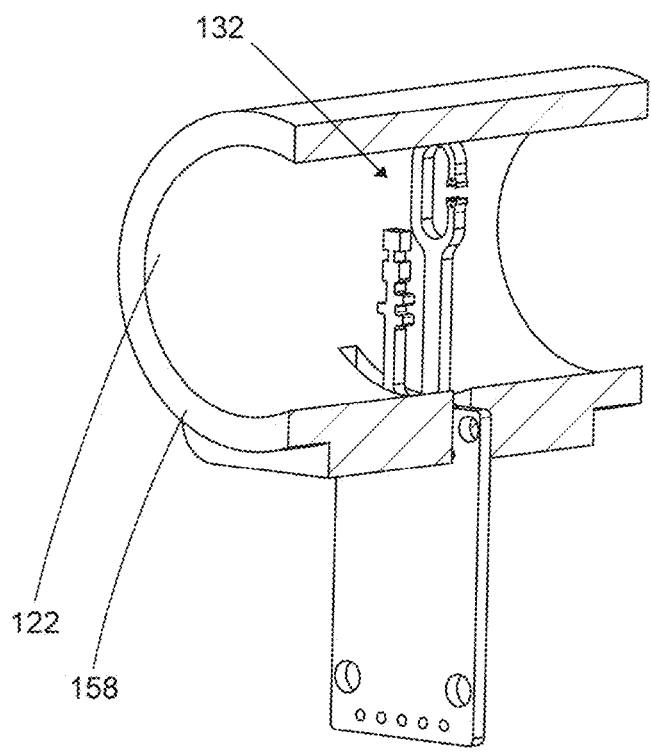
FIG. 5 is a cutaway view of the second passageway showing the embodiment of a solid-state velocity sensor of the embodiment of the sensor assembly shown in FIG. 1 extending into the second passageway.

FIG. 5 is a cutaway view of the second passageway showing the solid-state velocity sensor 132 of the solid-state airflow sensor device 100 embodiment shown in FIG. 1 extending into the second passageway 122. In some embodiments, the velocity sensor can be an off-the-shelf sensor and can be an open source device. For example and without limitation, the solid-state velocity sensor 132 can be a thermal anemometer such as a Wind Sensor Rev. P (https://moderndevice.com/product/wind-sensor-rev-p/) from Modern Device can be used with some embodiments disclosed herein.

With reference to FIG. 5, the velocity sensor 132 can be positioned or supported within a second pipe or channel 158 having the second passageway 122 extending axially therethrough. In some embodiments, the velocity sensor can be a non-solid-state sensor such as a spinning blade, a spinning cup or vane anemometer. The velocity sensor 132 can comprise a transducer configured to provide real-time readings of a velocity of flow of fluid through the second passageway 122. It should be appreciated that while the direction sensor 130 and the velocity sensor are illustrated and described as being positioned within the same device, in modified arrangements, the two sensors and their associated opening can be physically separated into two devices that are placed functionally near each other on a boundary or partition between spaces or zones.

The data generated by the first sensor 142, the second sensor 144, and the velocity sensor 132 can be processed by electronics in communication with such sensors. The first and second sensors 142, 144 can produce a calculated temperature difference between a first side of the device 100 and a second side of the device 100. This device 100 can be positioned on a partition or boundary wall within a data center. A controller or microprocessor in communication with the first and second sensors 142, 144 can be configured to calculate the pressure value using Bernoulli's equation. This equation relates the flow through a fixed orifice to the pressure difference across the opening. The calculated value can be sent to a control system to control or monitor air pressure in the space. In this manner, the pressure on either side of the device 100 can be more accurately controlled. In some embodiments, the controller can be configured to control or be in communication with a single sensor unit or can be configured to control or be in communication with a plurality of sensors. The controller can include a processor (e.g., a microprocessor) and a non-transitory computer-readable storage medium such as a persistent magnetic storage drive, solid state drive, etc., configured to store instructions that are executable by the processor to execute the instructions according to one or more control methods, as discussed further below. The execution of those instructions, whether the execution occurs in the processor or elsewhere, may control a system or sub-system(s) thereof. For example, when executed by a processor of the computer system, the instructions may cause the components of the system to operate.

FIG. 6 illustrates embodiments of equations that can be used to convert device flow to differential pressure that can be used with any of the embodiments of the solid-state sensor 100 disclosed herein to determine the pressure to a high degree of resolution and accuracy. As described, in some embodiments, with a measurement of velocity through a fixed size opening or passageway the pressure difference can be mathematically calculated using Bernoulli's Principle. The greater the pressure difference across a fixed opening or passageway, the greater the flow through that opening or passageway. Therefore, understanding the magnitude of the pressure difference across the fixed opening can yield information related to the flow through the opening.

As illustrated in FIG. 6, Bernoulli's equation can be shown as follows:

$$Q = CA_2 \sqrt{2(P_1 - P_2)/\rho}$$

Bernoulli's equation can be simplified for air, as follows:

$$Q = K(\sqrt{\Delta p})$$

Bernoulli's equation can be rewritten as an expression for differential pressure, as in the following two steps:

$$\frac{Q}{K} = \sqrt{\Delta p} ; \left(\frac{Q}{K}\right)^2 = \Delta p$$

Figure 7:
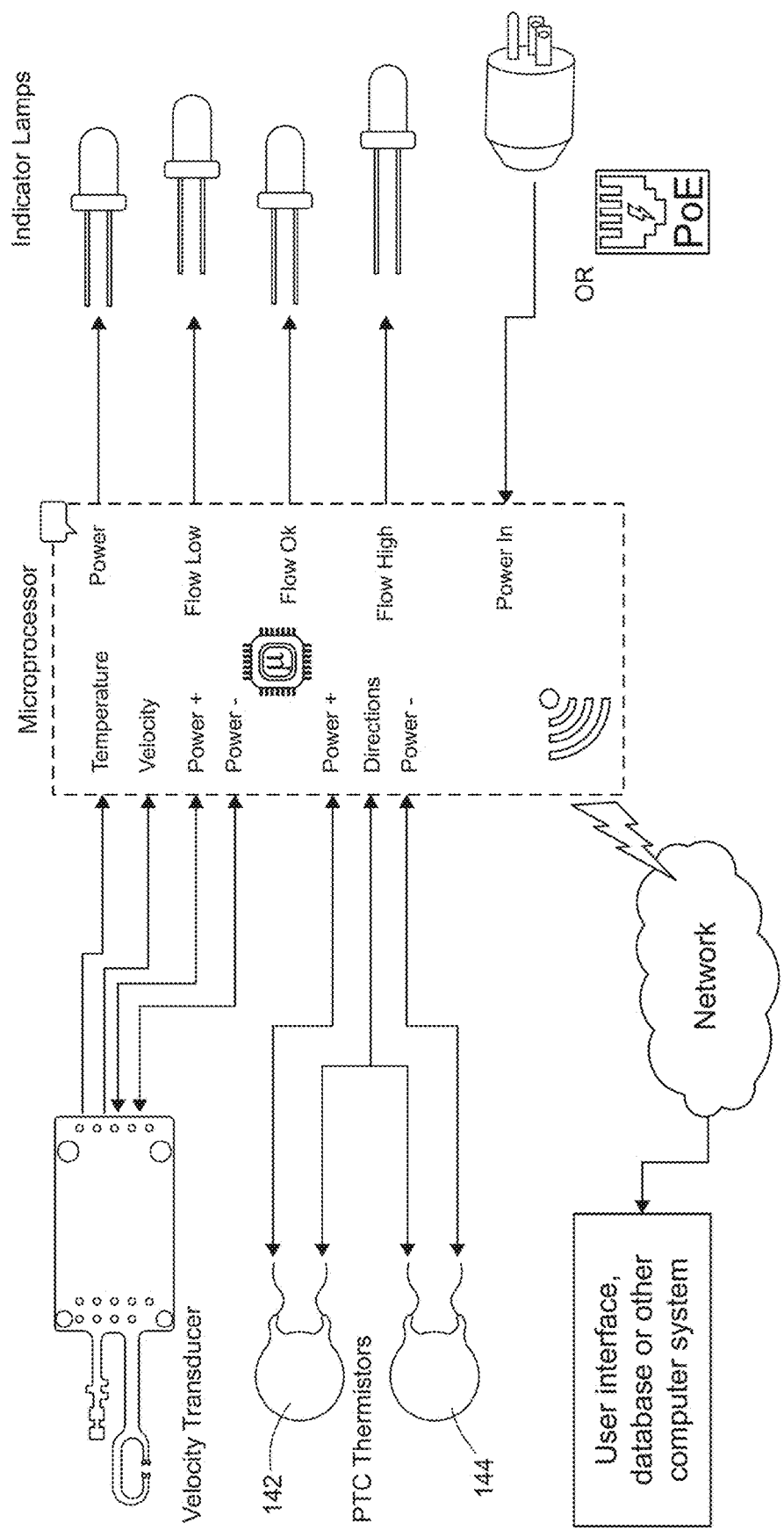
FIG. 7 shows an embodiment of a system diagram illustrating an embodiment of the system electronics that can be used with any embodiments of the sensor assembly disclosed herein.

In these equations:
Q=Velocity (ft/min) as measured by velocity sensor
K=Density Constant Air (+/−4005) adjusted at calibration
Δp=Pressure Delta (in WC.) output
P=Pressure readings on both side of opening
ρ=Density of fluid (air)
C=Velocity constant FIG. 7 shows an embodiment of a system diagram illustrating an embodiment of the system electronics that can be used with any embodiments of the solid-state sensor 100 disclosed herein. As shown in FIG. 7, any embodiments of the system can be configured to transmit data or other information via network and/or wired or wirelessly to a user interface, a database, a computer system, to a network storage device, or otherwise. Additionally, in any embodiments disclosed herein, the solid-state sensor 100 and/or any embodiments of a system that includes the solid-state sensor 100 can include one or more indicator lights and/or a display panel having a user interface that can be positioned on the housing or at any other location that can be used to indicate a flow direction, or other information related to the flow conditions of the system, based on data generated by the sensors.

Figure 8:
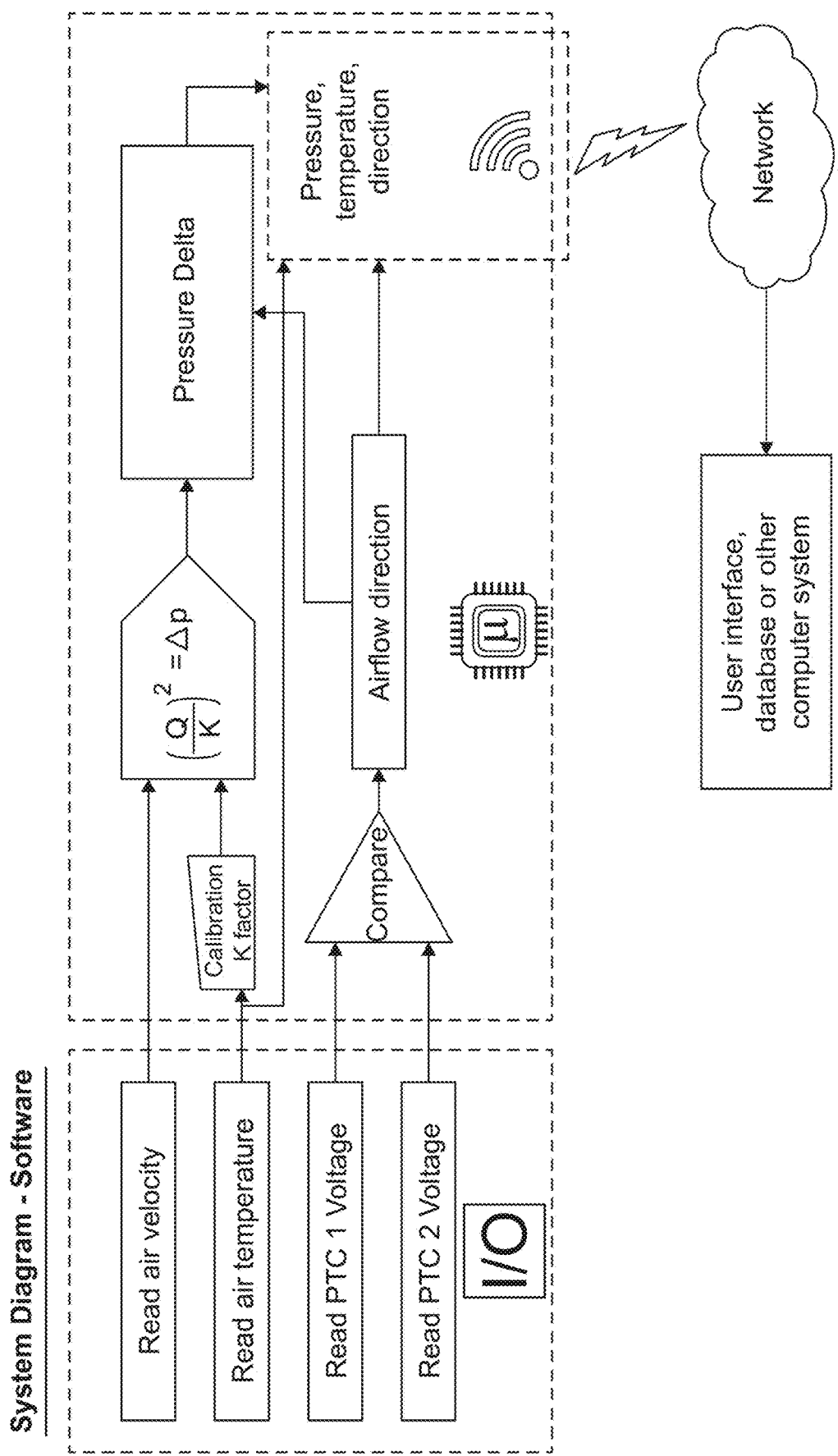
FIG. 8 illustrates an embodiment of a software system that can be used with any embodiments of the sensor assembly disclosed herein.

FIG. 8 illustrates an embodiment of a software system that can be used with any embodiments of the sensors disclosed herein. As illustrated, some embodiments of the system can be configured to read air velocity, read air temperature, read the voltage of the first sensor 142, and/or read the voltage of the second sensor 142. As described, a direction of the flow can be calculated using the direction sensor by comparing the voltage of the first sensor 142 to the voltage of the second sensor 144. As previously explained, Bernoulli's equation can be simplified to the equation below, which can be used to determine differential pressure (i.e., pressure delta) across an opening, given flow and orifice size.

$$\left(\frac{Q}{K}\right)^2 = \Delta p$$

By measuring flow through a fixed opening between two separate spaces, the pressure difference between the spaces can be determined. In some embodiments, the more flow measured through the fixed opening the higher the pressure difference between them. Some embodiments of the devices and systems disclosed herein can be used to determine which space has the higher or lower pressure. Some embodiments of the solid-state velocity sensor can measure flow regardless of direction.

FIG. 8 illustrates how differential pressure, temperature, and/or direction of flow of the fluid flowing through the system can be determined using a system that includes, without limitation, any of the embodiments of the sensor 100 disclosed herein, a velocity sensor, and/or a processor. In some embodiments, the system can have a transmitter configured to wirelessly or through wired components communicate one or more characteristics of a fluid flowing through a system that includes, without limitation, any of the embodiments of the sensor 100 disclosed herein and/or a velocity sensor. In some embodiments, the one or more characteristics can include differential pressure, temperature, and/or direction of flow of the fluid. Any of these characteristics and/or other characteristics can be uploaded wirelessly or via a wired connection to a network and/or to a user interface, database, or other computer system either directly or through the network.

In some embodiments, an onboard microprocessor can receive the signals from each sensor and calculate the pressure value based on flow velocity and direction across the sensor. The logic within the microprocessor can control the local screen or LED's to indicate a neutral, surplus or deficit pressure condition in the measured space. For example and without limitation, a green light can be used to communicate to an operator that a first zone or a first side of a barrier is experiencing a pressure surplus (i.e., wherein a pressure on a first side of the barrier or first zone is higher than a pressure on a second side of the barrier or in a second zone). A red light can be used to communicate to an operator that a first zone or a first side of a barrier is experiencing a pressure deficit (i.e., wherein a pressure on a first side of the barrier or first zone is lower than a pressure on a second side of the barrier or in a second zone). Further, in some embodiments, the lights can be configured to blink to indicate a magnitude of the pressure differential across the barrier—e.g., rapid blink or a high number of blinks in a sequence can indicate a high pressure differential, and a slow blink or a low number of blinks in a sequence can indicate a low pressure differential. Lights may be configured to indicate a proper or improper cooling delivery, temperature and/or pressure, in the area being monitored. For example, without limitation, a green light indicates proper cooling conditions, a blue light indicates an over cooled conditions and a red light indicates an improper cooling condition.

In some embodiments, the microprocessor can be configured to communicate the read data across a wireless connection (WLAN, BlueTooth, or Zigbee) to a central control system or building automation system or PLC so that the climate control system can automatically adjust climate settings based on the information received from any embodiments of the devices and systems disclosed herein.

Further, some embodiments of the solid-state sensor 100 and/or the systems disclosed herein can be used to control the air conditioning system in the space based on demand. The sensors of at least some of the embodiments disclosed herein can be used to determine airflow demand by measuring surplus or deficit pressure in containment areas. Locally, a technician can understand the 'health' of a contained zone by simply looking at the sensor lights and/or display. Furthermore, a technician can adjust floor tile quantities in the contained space and realize the effects by looking at the sensor once complete. For example and without limitation, the number of perforated floor tiles could be adjusted in response to the sensor readings, or the perforated floor tile modulating dampers could be adjusted in response to the sensor readings.

Additionally some embodiments of the sensor 100 disclosed herein can be used to measure space pressures as well. The sensor 100 could be used to measure a space pressure between the data hall and the rest of the facility. Data halls can be slightly pressurized relative to the hallway and outdoors to keep outside dust out of the data halls and electronics equipment. Additionally, there are applications for any of the embodiments of the sensors disclosed herein outside of data rooms. For example and without limitation, any embodiments of the sensors disclosed herein can be used to monitor and optimize air flow in isolation rooms in hospitals and in any other rooms or facilities wherein the operator would benefit from understanding airflow between partitions, barriers, cabinets, rooms, etc.

In some embodiments, LED lights or other types of lights or visual or audible indicators, the display, or visual or audible indicators on the display (collectively referred to herein as indicators) can glow different colors or change appearance or sound based on changes or levels of changes of operating parameters, including differences in pressure. Too much or too little pressure can indicate surplus or deficit airflow conditions. The use of indicators can provide information to enable data center operators to tune airflow conditions to match airflow demand and supply or otherwise optimize cooling of the electronics in the data room. The most efficient way to operate a data center is to deliver the right amount of air in the right places and the indicators can be used to provide information to the operators to optimize the air delivery. For example and without limitation, in some embodiments, the operator can and/or the system can be configured to automatically adjust fan speed, make valve adjustments to air and/or other fluid flow (e.g., coolant flow), or other changes to optimize cooling.

In one arrangement, embodiments of the sensor 100 can be used to measure airflow and pressure within containment spaces. For example, in data centers, it is advantageous to have different spaces that can isolate cooling zones from hot air streams. The air flow device can be positioned in a partition or boundary between the cooled and hot zones. In this manner, the information from the air flow sensor can be used to control the amount of air being delivered to the cooling zone and reduce energy costs while ensuring that the right amount of cooling is where it needs to be in the data hall. Traditionally, pressure sensors have been positioned on either side of the partition to ensure that hot air is not flowing into the cooled space. With embodiments of sensors 100 disclosed herein, the several air flow sensors 100 can be positioned along a partition and at different locations and can be used to ensure that the pressure within the cooling zone is higher than the pressure in the hot zone (i.e., flow through the device is flowing from the cooling zone to the hot zone and not vice versa). Air flow into the cooling zone can be adjusted if the pressure in the hot zone exceeds the pressure in the cooling zone.

Figure 9:
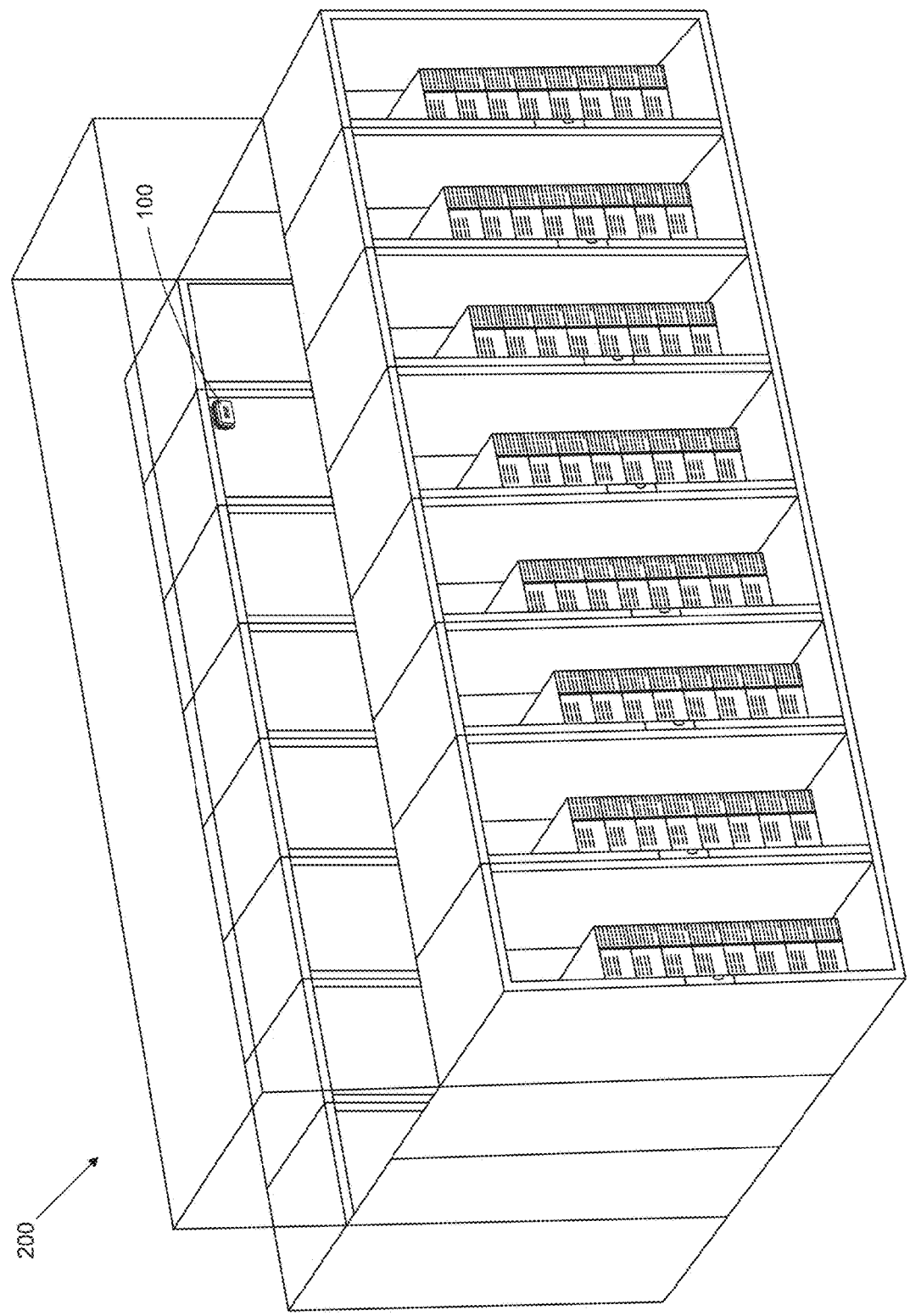
FIG. 9 is an orthogonal view of an embodiment of an offset cooling system showing an embodiment of a sensor assembly in fluid communication with an airflow through the system.
Figure 10:
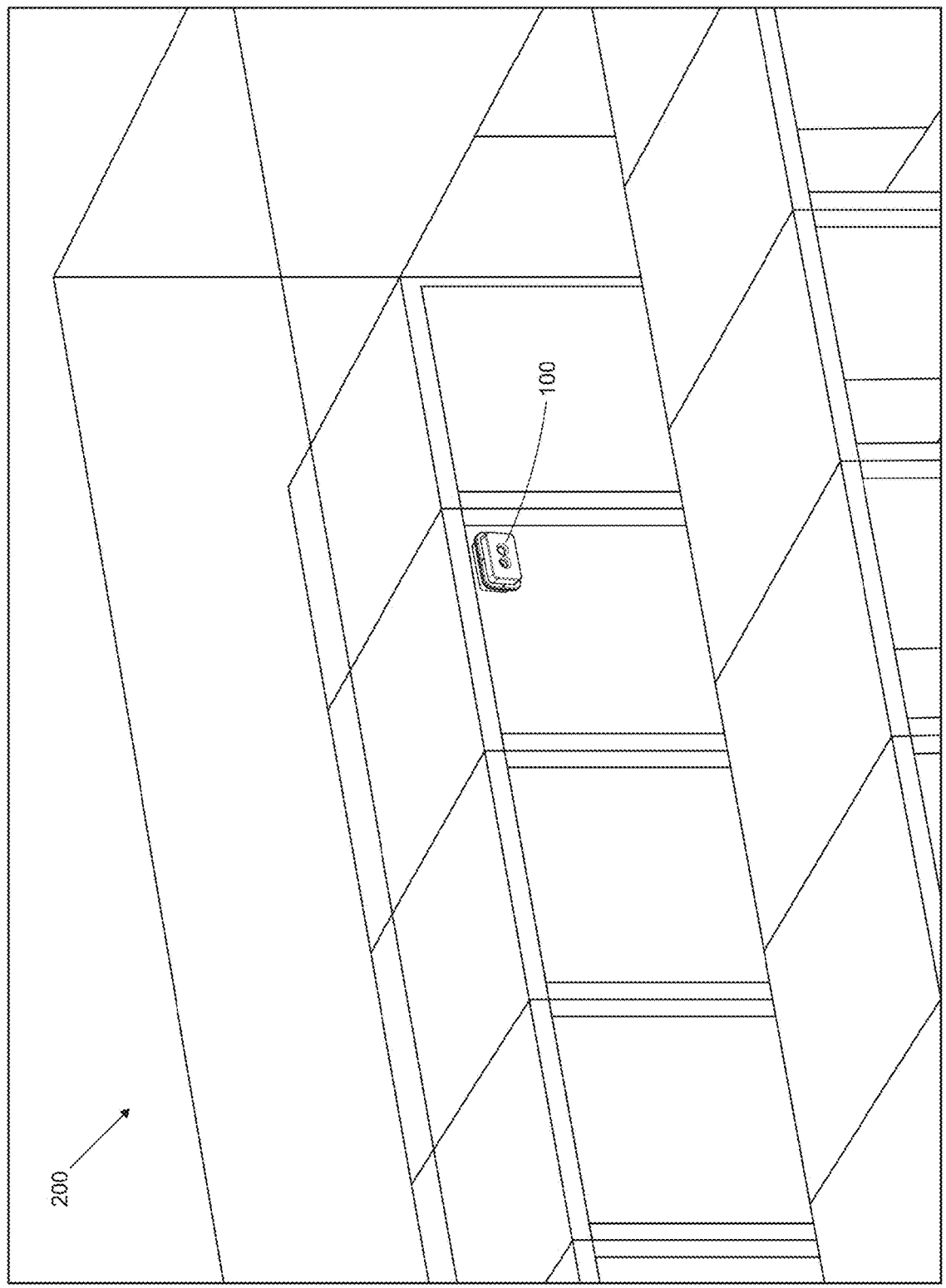
FIG. 10 is another orthogonal view of the embodiment of the offset cooling system shown in FIG. 9.
Figure 11:
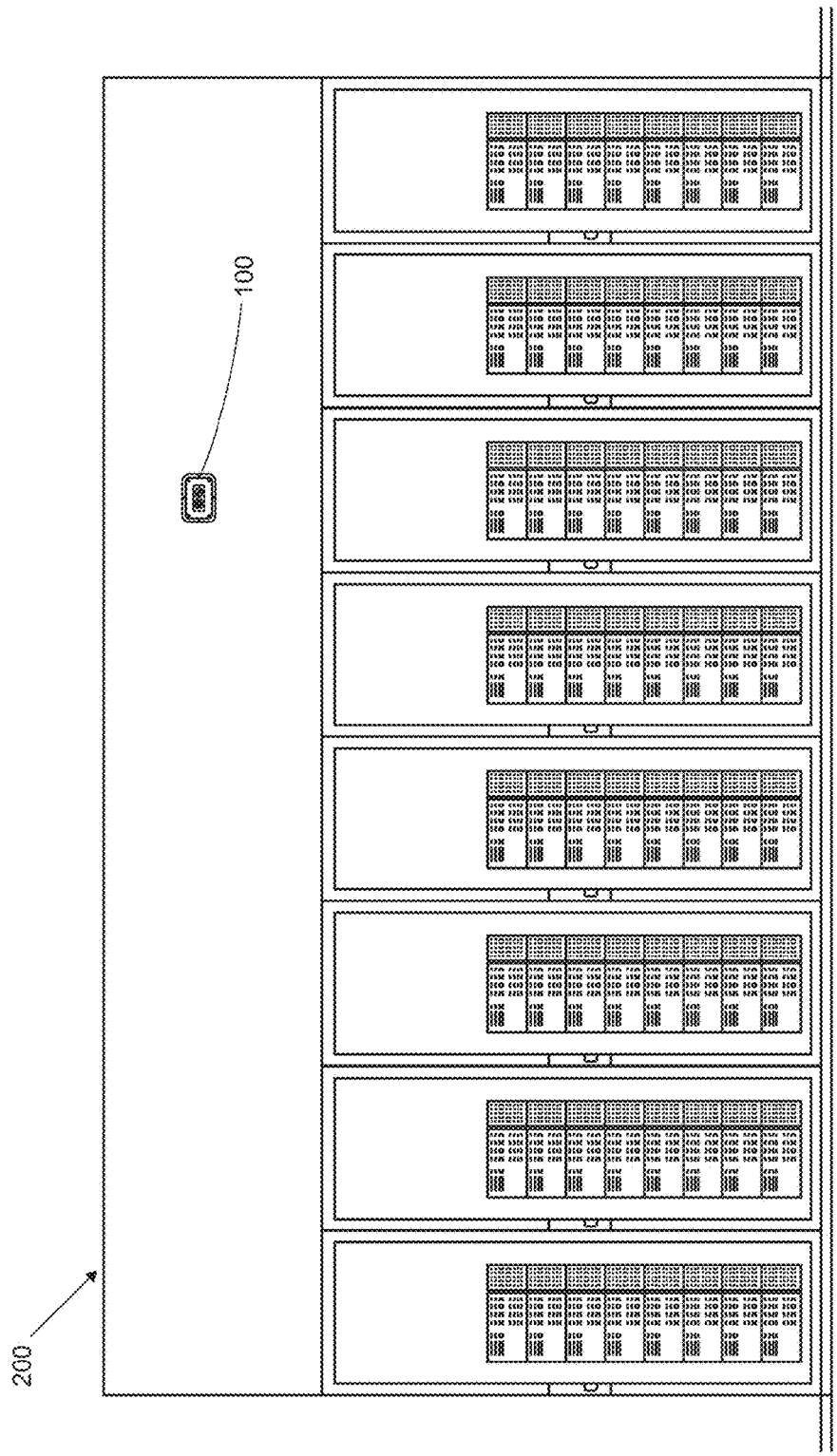
FIG. 11 is another orthogonal view of the embodiment of the offset cooling system shown in FIG. 9.

For example and without limitation, any embodiments of the airflow sensors disclosed herein (including the embodiments of the airflow sensors 100) can be used with cooling systems for data centers, the one or more airflow sensors 100 in fluid communication with an airflow through the system. In some embodiments, as shown in FIGS. 9-11, the one or more sensors 100 can be configured to determine a flow direction of air flowing through the system 200, a pressure of the air flowing through the system 200, velocity of the air flowing through the system 200, and/or temperature of the air flowing through the system 200. FIGS. 9-11 are orthogonal views of an embodiment of an exemplifying cooling system 200 that any embodiments of the sensors disclosed herein can be used with. FIGS. 9-11 show an embodiment of the airflow sensor 100 coupled with the system 200. In some embodiments, the sensor 100 can be in fluid communication with the air flowing through the system 200. For example and without limitation, in some embodiments, the sensor 100 can be supported by the ducting, such as the transition duct, of the system 200. In any embodiments disclosed herein, the sensor 100 can provide data to a controller of the system 200 that can be used to control the system 200 and/or one or more components of the system 200.

Figure 12:
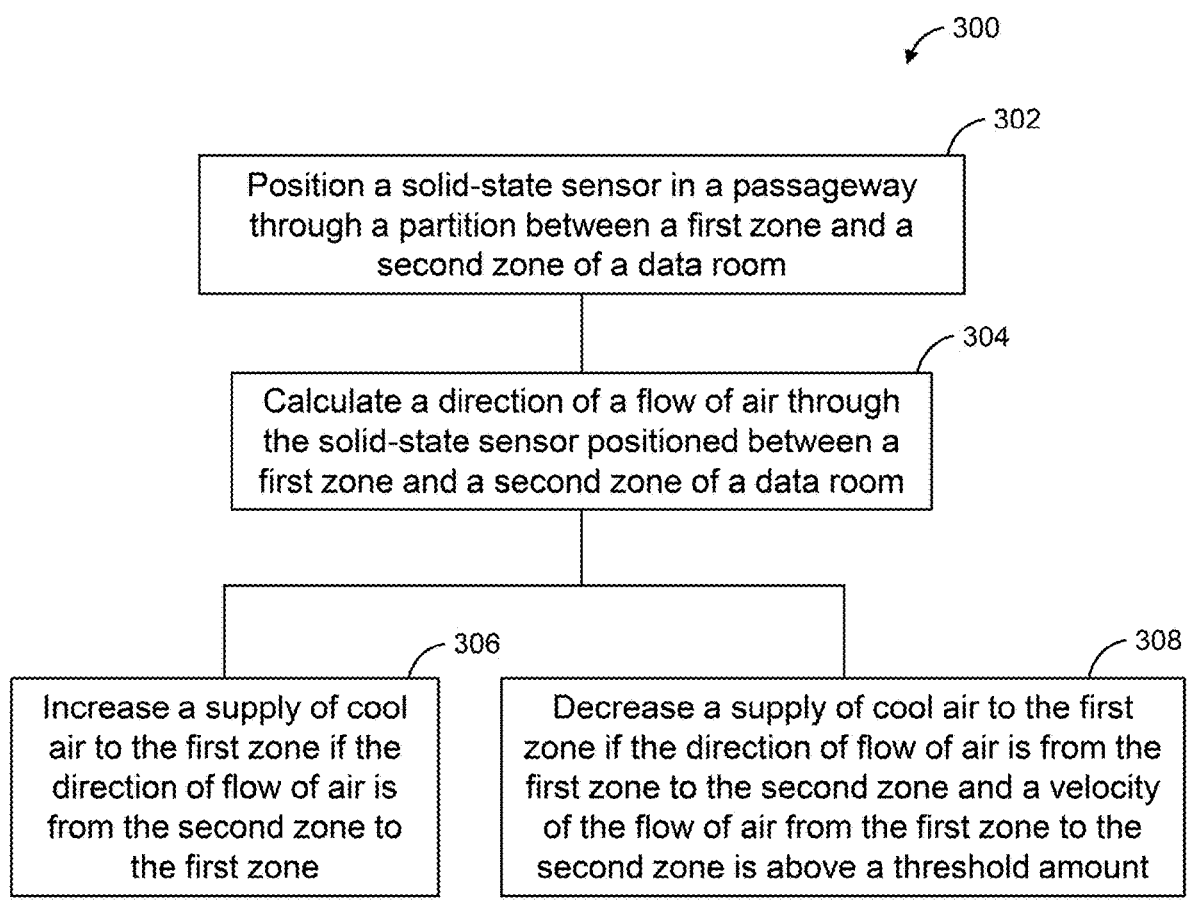
FIG. 12 shows an embodiment of a method of controlling a climate control system of a data room.

FIG. 12 shows an embodiment of a method of controlling a climate control system of a data room 300. In some embodiments, the method can include, at step 302 positioning a solid-state sensor in a passageway through a partition between a first zone and a second zone of a data room, at step 304, calculating a direction of a flow of air through the passageway and/or solid-state sensor positioned between a first zone and a second zone of a data room, and/or at step increasing a supply of cool air to the first zone if the direction of flow of air is from the second zone to the first zone (as in step 306) or decreasing a supply of cool air to the first zone if the direction of flow of air is from the first zone to the second zone and a velocity of the flow of air from the first zone to the second zone is above a threshold amount. In this embodiment, the first zone can be a cooling zone and the second zone can be a hot zone. In some embodiments, the temperature of the air supplied and the volume of air can also be adjusted, based on data received from the sensor. A network of sensors 100 can be used to control fan speeds within the data center. Sensors 100 can be used to determine what pod of cabinets within a room is controlling the air conditioning systems. Supply and return airflow control devices can be adjusted to optimize the air conditioning systems. Some embodiments of the sensor 100 can be configured to measure flow and control of the system can be based on differential pressure, and velocity can be used to determine pressure difference.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the systems and methods described herein may be made without departing from the spirit of the disclosure. The accompanying claims and their equivalents are intended to cover such forms or modifications as would fall within the scope and spirit of the disclosure. Accordingly, the scope of the present inventions is defined only by reference to the appended claims.

Features, materials, characteristics, or groups described in conjunction with a particular aspect, embodiment, or example are to be understood to be applicable to any other aspect, embodiment or example described in this section or elsewhere in this specification unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

Furthermore, certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as a subcombination or variation of a sub combination.

Moreover, while operations may be depicted in the drawings or described in the specification in a particular order, such operations need not be performed in the particular order shown or in sequential order, or that all operations be performed, to achieve desirable results. Other operations that are not depicted or described can be incorporated in the example methods and processes. For example, one or more additional operations can be performed before, after, simultaneously, or between any of the described operations. Further, the operations may be rearranged or reordered in other implementations. Those skilled in the art will appreciate that in some embodiments, the actual steps taken in the processes illustrated and/or disclosed may differ from those shown in the figures. Depending on the embodiment, certain of the steps described above may be removed, others may be added. Furthermore, the features and attributes of the specific embodiments disclosed above may be combined in different ways to form additional embodiments, all of which fall within the scope of the present disclosure. Also, the separation of various system components in the implementations described above should not be understood as requiring such separation in all implementations, and it should be understood that the described components and systems can generally be integrated together in a single product or packaged into multiple products.

For purposes of this disclosure, certain aspects, advantages, and novel features are described herein. Not necessarily all such advantages may be achieved in accordance with any particular embodiment. Thus, for example, those skilled in the art will recognize that the disclosure may be embodied or carried out in a manner that achieves one advantage or a group of advantages as taught herein without necessarily achieving other advantages as may be taught or suggested herein.

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, or 0.1 degree.

The scope of the present disclosure is not intended to be limited by the specific disclosures of preferred embodiments in this section or elsewhere in this specification, and may be defined by claims as presented in this section or elsewhere in this specification or as presented in the future. The language of the claims is to be interpreted broadly based on the language employed in the claims and not limited to the examples described in the present specification or during the prosecution of the application, which examples are to be construed as non-exclusive.

What is claimed is:

1. A sensor assembly, comprising:
an enclosure housing having a first opening in a first side of the enclosure and a second opening in a second side of the enclosure;
a first passageway in fluid communication with the first and second openings;
a solid-state sensor positioned within the first passageway, the solid-state sensor comprising:
a first sensor positioned at a first axial position in the first passageway;
a second sensor positioned at a second axial position in the first passageway; and a flow deflector positioned at a third axial position in the first passageway that is between the first and second axial positions, the flow deflector extending into the first passageway so as to constrict the first passageway;

wherein the flow deflector includes a first recess on a first side of the flow deflector and a second recess on a second side of the flow deflector; and wherein the first sensor is positioned adjacent to the first recess and the second sensor is positioned adjacent to the second recess.

2. The sensor assembly of claim 1, wherein the flow deflector is configured to deflect at least a portion of a flow of a fluid flowing through the first passageway in a first direction around the second sensor but not the first sensor, wherein the second sensor is downstream of the first sensor when a fluid is flowing in the first direction.

3. The sensor assembly of claim 1, wherein the flow deflector is configured to deflect at least a portion of a flow of a fluid flowing through the first passageway in a second direction around the first sensor but not the second sensor, wherein the first sensor is downstream of the second sensor when a fluid is flowing in the second direction.

4. The sensor assembly of claim 1, wherein the first and second recesses are positioned symmetrically about the flow deflector.

5. The sensor assembly of claim 1, further comprising an airflow velocity sensor.

6. The sensor assembly of claim 1, wherein at least one of the first and second sensors is a thermistor element that has a positive temperature coefficient (PTC).

7. The sensor assembly of claim 1, wherein the solid-state sensor is configured to measure a temperature of the air flowing through the sensor assembly.

8. The sensor assembly of claim 1, wherein the solid-state sensor has an accuracy of at least 99.75% over a full range of readings of the solid-state sensor.

9. A system comprising the sensor assembly of claim 1, comprising a processor configured to determine a pressure of the air flowing through the sensor assembly.

10. A system comprising the sensor assembly of claim 1 and one or more indicator lights configured to indicate at least one of a flow direction of air passing through the solid-state sensor, proper or improper cooling delivery, temperature, and pressure in an area being monitored.

11. A system comprising the sensor assembly of claim 1 and a display panel configured to indicate a flow direction of air passing through the solid-state sensor and/or other information related to the air to which the solid-state sensor is exposed.

12. A system for controlling a thermal management system in a data center having a first zone and a second zone, comprising:
the sensor assembly of claim 1; and
a controller for cooling air supplied to the first zone;
wherein:
the sensor assembly is located in a partition between a first zone and a second zone; and
the controller is configured to increase a flow of air to the first zone when either a pressure differential between the first zone and the second zone drops below a threshold value and/or wherein a direction of a flow of air through the sensor assembly is from the second zone to the first zone.

13. The system for controlling a thermal management system in a data center of claim 12, wherein the first zone is a cool zone and the second zone is a hot zone.

14. The sensor assembly of claim 1, wherein the first recess is configured to curve around the first sensor and the second recess is configured to curve around the second sensor.

15. A sensor assembly, comprising:
an enclosure housing having a first opening in a first side of the enclosure and a second opening in a second side of the enclosure;
a first passageway in fluid communication with the first and second openings;
a solid-state sensor positioned within the first passageway, the solid-state sensor comprising:
a first sensor positioned at a first axial position in the first passageway;
a second sensor positioned at a second axial position in the first passageway; and
a flow deflector positioned at a third axial position in the first passageway that is between the first and second axial positions, the flow deflector extending into the first passageway so as to constrict the first passageway;
wherein the flow deflector includes a first recess on a first side of the flow deflector and a second recess on a second side of the flow deflector;
wherein the first sensor is positioned adjacent to the first recess and the second sensor is positioned adjacent to the second recess; and
wherein the first and second recesses are positioned symmetrically about the flow deflector.

16. The sensor assembly of claim 15, wherein the flow deflector is configured to deflect at least a portion of a flow of a fluid flowing through the first passageway in a first direction around the second sensor but not the first sensor, wherein the second sensor is downstream of the first sensor when a fluid is flowing in the first direction.

17. The sensor assembly of claim 15, wherein the flow deflector is configured to deflect at least a portion of a flow of a fluid flowing through the first passageway in a second direction around the first sensor but not the second sensor, wherein the first sensor is downstream of the second sensor when a fluid is flowing in the second direction.

18. A system for controlling a thermal management system in a data center having a first zone and a second zone, comprising:
the sensor assembly of claim 15; and
a controller for cooling air supplied to the first zone;
wherein:
the sensor assembly is located in a partition between a first zone and a second zone; and
the controller is configured to increase a flow of air to the first zone when either a pressure differential between the first zone and the second zone drops below a threshold value and/or wherein a direction of a flow of air through the sensor assembly is from the second zone to the first zone.

19. A sensor assembly, comprising:
an enclosure housing having a first opening in a first side of the enclosure and a second opening in a second side of the enclosure;
a first passageway in fluid communication with the first and second openings;
a solid-state sensor positioned within the first passageway, the solid-state sensor comprising:
a first sensor positioned at a first axial position in the first passageway;
a second sensor positioned at a second axial position in the first passageway; and a flow deflector positioned at a third axial position in the first passageway that is between the first and second axial positions, the flow deflector extending into the first passageway so as to constrict the first passageway;

wherein:
the flow deflector includes a first recess on a first side of the flow deflector and a second recess on a second side of the flow deflector;
the first sensor is positioned adjacent to the first recess and the second sensor is positioned adjacent to the second recess;
the flow deflector is configured to deflect at least a portion of a flow of a fluid flowing through the first passageway in a first direction around the second sensor but not the first sensor, wherein the second sensor is downstream of the first sensor when a fluid is flowing in the first direction; and
the flow deflector is configured to deflect at least a portion of a flow of a fluid flowing through the first passageway in a second direction around the first sensor but not the second sensor, wherein the first sensor is downstream of the second sensor when a fluid is flowing in the second direction.

20. A system for controlling a thermal management system in a data center having a first zone and a second zone, comprising:
the sensor assembly of claim 19; and
a controller for cooling air supplied to the first zone;
wherein:
the sensor assembly is located in a partition between a first zone and a second zone; and
the controller is configured to increase a flow of air to the first zone when either a pressure differential between the first zone and the second zone drops below a threshold value and/or wherein a direction of a flow of air through the sensor assembly is from the second zone to the first zone.

* * * * *